United States Patent
Wall et al.

(10) Patent No.: US 12,160,240 B2
(45) Date of Patent: Dec. 3, 2024

(54) METHOD AND SYSTEM FOR GENERATING PHONONIC FREQUENCY COMB

(71) Applicant: HRL Laboratories, LLC, Malibu, CA (US)

(72) Inventors: Walter S. Wall, Malibu, CA (US); Randall L Kubena, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 59 days.

(21) Appl. No.: 18/133,480

(22) Filed: Apr. 11, 2023

(65) Prior Publication Data

US 2024/0039517 A1 Feb. 1, 2024

Related U.S. Application Data

(60) Provisional application No. 63/393,753, filed on Jul. 29, 2022.

(51) Int. Cl.
| | |
|---|---|
| *H03K 3/01* | (2006.01) |
| *H03B 5/04* | (2006.01) |
| *H03B 5/32* | (2006.01) |
| *H03B 5/36* | (2006.01) |

(52) U.S. Cl.
CPC ............ *H03K 3/01* (2013.01); *H03B 5/04* (2013.01); *H03B 5/32* (2013.01); *H03B 5/366* (2013.01)

(58) Field of Classification Search
CPC ... H03K 3/01; H03B 5/04; H03B 5/32; H03B 5/366; H03H 9/19
See application file for complete search history.

(56) References Cited

U.S. PATENT DOCUMENTS

| | | | |
|---|---|---|---|
| 4,070,635 | A  | 1/1978  | Healey, III |
| 4,132,964 | A  | 1/1979  | Wilcox |
| 4,257,001 | A  | 3/1981  | Partain |
| 6,054,856 | A  | 4/2000  | Garroway |
| 6,433,543 | B1 | 8/2002  | Shahinpoor |
| 7,237,315 | B2 | 7/2007  | Kubena |
| 7,459,099 | B2 | 12/2008 | Kubena |
| 7,750,535 | B2 | 7/2010  | Kubena |
| 7,851,971 | B2 | 12/2010 | Chang |
| 8,601,607 | B2 | 12/2013 | Hagmann |
| 8,765,615 | B1 | 7/2014  | Chang |
| 8,994,465 | B1 | 3/2015  | Kubena |
| 10,110,198 | B1 | 10/2018 | Kubena |
| 10,389,392 | B1 | 8/2019  | Kubena |
| 10,819,276 | B1 | 10/2020 | Kubena |
| 11,156,897 | B2 | 10/2021 | Kubena |
| 11,239,823 | B1 | 2/2022  | Kubena |

(Continued)

FOREIGN PATENT DOCUMENTS

| | | |
|---|---|---|
| KR | 10-2008-0044977 | 5/2008 |
| KR | 10-2012-0132987 | 12/2012 |

(Continued)

OTHER PUBLICATIONS

U.S. Appl. No. 16/932,427, Kubena, filed Jul. 17, 2020.

(Continued)

*Primary Examiner* — Jeffrey M Shin
(74) *Attorney, Agent, or Firm* — Ladas & Parry, LLP

(57) ABSTRACT

A method and an apparatus for coupling two nonlinear resonators via a nonlinear element to generate phononic frequency combs.

20 Claims, 9 Drawing Sheets

(56) References Cited

U.S. PATENT DOCUMENTS

| | | |
|---|---|---|
| 11,275,099 B1 | 3/2022 | Sorenson |
| 11,431,293 B1 | 8/2022 | Kubena |
| 11,563,420 B1 | 1/2023 | Kubena |
| 11,567,147 B1 | 1/2023 | Kubena |
| 11,575,348 B1 | 2/2023 | Song |
| 11,606,098 B1 | 3/2023 | Kubena |
| 2010/0295546 A1 | 11/2010 | Walther |
| 2010/0321117 A1 | 12/2010 | Gan |
| 2012/0294319 A1 | 11/2012 | Maleki |
| 2015/0107357 A1 | 4/2015 | Hentz |
| 2015/0326320 A1 | 11/2015 | Fertig |
| 2017/0047893 A1 | 2/2017 | Nguyen |
| 2018/0157148 A1 | 6/2018 | Kim |
| 2019/0181611 A1 | 6/2019 | Maleki |
| 2019/0250198 A1 | 8/2019 | Kubena |
| 2020/0158769 A1 | 5/2020 | Liu |
| 2021/0091748 A1* | 3/2021 | Kubena ............... H03B 5/366 |

FOREIGN PATENT DOCUMENTS

| | | |
|---|---|---|
| WO | 2014-018444 | 1/2014 |
| WO | 2019-094509 | 5/2019 |
| WO | 2019-217668 | 11/2019 |

OTHER PUBLICATIONS

U.S. Appl. No. 16/932,447, Kubena, filed Jul. 17, 202.
U.S. Appl. No. 17/567,034, Kubena, filed Dec. 31, 2021.
U.S. Appl. No. 17/841,344, Kubena, filed Jun. 15, 2022.
U.S. Appl. No. 16/932,447 (non-publication request filed), filed on Jul. 17, 2020 (Inventor: Kubena, non-publication request filed).
From U.S. Appl. No. 16/932,447 (unpublished, non-publication request filed), Office Action mailed on Feb. 22, 2023.
U.S. Appl. No. 16/932,427 (non-publication request filed), filed on Jul. 17, 2020 (Inventor: Kubena, non-publication request filed).
U.S. Appl. No. 17/567,034 (non-publication request filed), filed on Dec. 31, 2021, (Inventor: Kubena, non-publication request filed).
From U.S. Appl. No. 17/567,034 (non-publication request filed), Office Action dated Feb. 10, 2023.
From U.S. Appl. No. 17/567,034 (non-publication request filed), Office Action dated Jun. 7, 2023.
From U.S. Appl. No. 17/567,034 (non-publication request filed), Office Action dated Oct. 3, 2022.
U.S. Appl. No. 17/841,344 (non-publication request filed), filed on Jun. 15, 2022, (Inventor: Kubena, non-publication request filed).
U.S. Appl. No. 18/208,894 (non-publication request filed), filed on Jun. 13, 2023, (Inventor: Kubena, non-publication request filed).
From U.S. Appl. No. 16/932,431 (now U.S. Pat. No. 11,567,147), Notice of Allowance mailed on Dec. 7, 2022.
From U.S. Appl. No. 16/932,431 (now U.S. Pat. No. 11,567,147), Notice of Allowance mailed on Sep. 21, 2022.
From U.S. Appl. No. 16/932,455 (now U.S. Pat. No. 11,156,897), Notice of Allowance mailed on Jun. 23, 2021.
From U.S. Appl. No. 16/932,455 (now U.S. Pat. No. 11,156,897), Office Action mailed on Apr. 22, 2021.
From U.S. Appl. No. 17/347,403 (now U.S. Pat. No. 11,575,348), Notice of Allowance mailed on Sep. 29, 2022.
From U.S. Appl. No. 17/348,344 (now published as U.S. Pat. No. 11,431,293), Notice of Allowance mailed on Apr. 26, 2022.
From U.S. Appl. No. 17/348,344 (now published as U.S. Pat. No. 11,431,293), Office Action mailed on Jan. 27, 2022.
From U.S. Appl. No. 17/677,849 (now U.S. Pat. No. 11,606,098), Notice of Allowance dated Nov. 18, 2022.
PCT International Search Report and Written Opinion from PCT/US2020/051863 dated Jan. 4, 2021.
PCT International Preliminary Report on Patentability Chapter I from PCT/US2020/051863 dated Apr. 7, 2022.
URL: https://en.wikipedia.org/wiki/Capacitive_sensing (page was last edited on May 10, 2021 at 08:25 (UTC)).

Analog Devices, Phase Detector/Frequency Synthesizer, model ADF4002, Norwood, MA, 2006-2015, 20 pages.
Askari, S. et al., "Near-Navigation Grade Quad Mass Gyroscope With Q-Factor Limited by Thermo-Elastic Damping," Solid-State, Actuators, and Microsystems Workshop Technical Digest, Hilton Head, South Carolina, USA, Jun. 5-9, 2016, pp. 254-257.
Bennett, S. P. et al., "Magnetic Field Response of Doubly Clamped Magnetoelectric Microelectromechanical AlN-FeCo Resonators," Applied Physics Letters 111, 252903 (Dec. 22, 2017), 6 pages.
Bhatia, A. et al., "Linearization of Phase-Modulated Analog Optical Links using a Four-Wave Mixing Comb Source," Optics Express, DOI: 10.1364/OE.22.030899, Dec. 4, 2014, 11 pages.
Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Czaplewski, D., et al.l, "Frequency Comb Generation in a Nonlinear Resonator Through Mode Coupling Using a Single Tone Driving Signal" in Solid-State Sensors, Actuators and Microsystems Workshop Hilton Head Island, South Carolina, Jun. 3-7, 2018, pp. 79-82.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A., et al., "Excitation of coupled phononic frequency combs via two-mode parametric three-wave mixing," Physical Review B 97 (2018): 014302, Jan. 3, 2018, 6 pages.
Ganesan, A., et al., "Phononic Frequency Combs for Engineering MEMS/NEMS Devices with Tunable Sensitivity," 2019 IEEE (4 pages).
Ganesan, A. et al., "Phononic Frequency Comb via Intrinsic Three-Wave Mixing," Physical Review Letters, PRL 118, 033903 (2017), Jan. 17, 2017, (5 pages).
Ganesan, Adarsh et al., "Phononic frequency comb via three-mode parametric resonance" Applied Physics Letters 112 (2018): 021906; Jan. 10, 2018.
Hati, A. et al., "Oscillator PM noise reduction from correlated AM noise," IEEE Transactions on Ultrasonics, Ferroelectrics, and Frequency Control, vol. 63, No. 3 (Mar. 2016): 463-469.
Hati, A., et al., "Reducing oscillator PM noise from AM-PM noise correlation," Electronics Letters, vol. 50, No. 17 (2014): 1195-1197, Aug. 14, 2014.
Howe, et al., "PM-AM correlation measurements and analysis," May 2012, IEEE International Frequency Control Symposium Proceedings (5 pages).
Hui, Y. et al., "High Resolution Magnetometer Based on a High Frequency Magnetoelectric MEMS-CMOS Oscillator," Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003), Apr. 10, 2003.
Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.
Kubena, et al., "A Fully Integrated Quartz MEMS VHF TCXO," 2017 IEEE Frequency Control Symposium, Besancon, Fr., pp. 68-71, Jul. 2017.
Kubena, R., et al., "Nonlinear Analysis of Phononic Comb Generation in High-Q Quartz Resonators," 2020 Joint Conference of the IEEE International Frequency Control Symposium and International Symposium on Applications of Ferroelectrics (IFCS-ISAF), Jul. 2020.
Kubena, R. L., et al. "Phononic Comb Generation in High-Q Quartz Resonators", Applied Physics Letters, 116, 053501 (2020), Feb. 4, 2020.
Leeson, D. B., et al., "Short-term Stability for a Doppler Radar: Requirements, Measurements, and Techniques," Proceedings of IEEE, vol. 54, No. 2, pp. 244-248, Feb. 1966.
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Neji, N. et al., FPGA Implementation of the CORDIC Algorithm for Fingerprints Recognition Systems, International Journal of Computer Applications, vol. 63, No. 6, Feb. 2013, pp. 39-45.

(56) References Cited

OTHER PUBLICATIONS

Park, M., et al., "Phononic frequency combs in stand-alone piezoelectric resonators" 2018 IEEE International Frequency Control Symposium (IFCS), IEEE, 2018, 4 pages.

Pinto, A. N., "Timing Jitter in Optical Communication Systems," Frontiers in Optics, OSA Technical Digest (CD) (Optical Society of America, 2006), paper FMD5 (1 page).

Qi, Z., et al., "Existence conditions for phononic frequency combs", Applied Physics Letters, 117(18), 183503, Nov. 5, 2020.

Quitin, François, et al., "Distributed receive beamforming: A scalable architecture and its proof of concept." 2013 IEEE 77th Vehicular Technology Conference (VTC Spring) (5 pages).

Roy, S., FPGA implementation of 8-point FFT, May 14, 2019 available on-line at https://digitalsystemdesign.in/fpga-implementation-of-8-point-fft (Printed on Apr. 1, 2022).

Sheng, et al., "A Microfabricated Optically-Pumped Magnetic Gradiometer," Applied Physics Letters 110, 031106 (2017), Jan. 18, 2017, 5 pages.

Singh, R., et al., "Giant Tunable Mechanical Nonlinearity in Graphene-Silicon Nitride Hybrid Resonator" published Jun. 23, 2020, see arxiv.org/pdf/1904.01613.pdf, 26 pages.

Trochimiuk, M., "FPGA programming how it works and where it can be used" available online at https://codilime.com/blog/FPGA-programming-how-it-works-and-where-it-can-be-used/ (Printed on Apr. 1, 2022).

Veryaskin, A. "Gravity, Magnetic and Electromagnetic Gradiometry: Strategic Technologies in the 21st century", IOP Concise Physics, ebooks, 2018 (57 pages).

Vrba, J., "SQUID Sensors: Fundamentals, Fabrication and Applications," edited by H. Weinstock, Kluwer Academic, Dordrecht, The Netherlands, 1996, p. 117.

Wall, W. S., et al., "Phase Noise Transfer in High-Q Quartz Phononic Frequency Combs," 2020 IEEE Ultrasonics Sym., Las Vegas, NV. Sep. 6-11, 2020, 4 pages.

Wang, S. et al., "A MEMS Resonant Accelerometer for Low-Frequency Vibration Detection," Sensors and Actuators A: Physical, 283, Nov. 2018, pp. 151-158.

WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers, Jun. 18-22, 2017, pp. 599-602.

Yao, et. al., "Bulk Acoustic Wave-Mediated Multiferroic Antennas: Architecture and Performance Bound," IEEE Transactions on Antennas and Propagation, vol. 63, No. 8, Aug. 2015, pp. 3335-3344.

Yong, Y. et al., "An Averaging Method for Phase Noise Studies of Quartz Phononic Frequency Combs," IEEE Ultrasonics Transactions, 2023, (8 pages).

Yong, Y., et al., "Nonlinear 2-D Modeling of Phononic Frequency Comb Generation in Quartz AT-cut Resonators," 2021 IEEE Ultrasonics Sym. (IUS), Sep. 12-15, 2021.

Zhai, J., et al., "Detection of Pico-Tesla Magnetic Fields using Magneto-Electric Sensors at Room Temperature," Applied Physics Letters, 88, 062510 (2006), Feb. 9, 2006, 5 pages.

U.S. Appl. No. 18/208,894, Kubena, filed Jun. 13, 2023.

U.S. Appl. No. 18/208,894 (unpublished, non-publication request filed) filed on Jun. 13, 2023, Inventor: Kubena, R. et al.

From U.S. Appl. No. 18/208,894 (unpublished, non-publication request filed), Office Action mailed on Aug. 8, 2024.

\* cited by examiner

METHOD AND SYSTEM FOR GENERATING PHONONIC FREQUENCY COMB

This application is related to and claims the benefit of U.S. Provisional Application Ser. No. 63/393,753 filed on Jul. 29, 2022, and entitled "A Nonlinear Resonator System for Low Noise Phononic Comb Generation," the disclosure of which is hereby incorporated herein by reference in its entirety.

This application is related to the technology disclosed in U.S. Provisional Patent Application No. 63/222,880 filed 16 Jul. 2021 and entitled "Acoustically Coupled Dual Resonators for Phononic Frequency Comb Generation" and to its related non-provisional U.S. patent application Ser. No. 17,1841,344 filed 15 Jun. 2022, the disclosure of which is hereby incorporated herein by reference in its entirety.

This application is also related to the technology disclosed in U.S. Provisional Patent Application Ser. No. 63/083,619 filed 25 Sep. 2020 and entitled "Noise Suppression in a Phononic Comb" and to its related non-provisional U.S. patent application Ser. No. 17/348,344 filed 15 Jun. 2021, the disclosures of which are hereby incorporated herein by reference in their entireties.

This application is also related to the technology disclosed in U.S. Provisional Patent Application Ser. No. 62/904,052, filed 23 Sep. 2019, and entitled "Enhanced Stability Oscillators using a Phononic Comb", and to its related non-provisional U.S. patent application Ser. No. 16/932,455, filed 17 Jul. 2020, and having the same title as its related provisional application, the disclosures of which are hereby incorporated herein by reference in their entireties.

This application is also related to the technology disclosed in U.S. Provisional Patent Application Ser. No. 62/881,069, filed 31 Jul. 2019 and entitled "Phononic Comb Enhanced Gradiometers" and its corresponding non-provisional U.S. patent application Ser. No. 16/932,431, filed 17 Jul. 2020, and having the same title as its related provisional application, the disclosures of which are hereby incorporated herein by reference in their entireties.

This application is also related to the technology disclosed in U.S. Provisional Patent Application Ser. No. 62/890,799, filed 23 Aug. 2019 and entitled "Phononic Comb Enhanced Gravity Gradiometers" and its corresponding non-provisional U.S. patent application Ser. No. 16/932,447, filed 17 Jul. 2020, and having the same title as its related provisional application, the disclosures of which are hereby incorporated herein by reference in their entireties.

This application is also related to the technology disclosed in U.S. Provisional Patent Application Ser. No. 63/152,506 filed 23 Feb. 2021 and entitled "Comb Enhanced Oscillator with AM-to-PM Noise Suppression", and its corresponding non-provisional U.S. patent application Ser. No. 17/677,849, filed 22 Feb. 2022, and having the same title as its related provisional application, the disclosure of which is hereby incorporated herein by reference in its entire This application is also related to the technology disclosed in U.S. Provisional Patent Application Ser. No. 63/144,614 filed 2 Feb. 2021 and entitled "Phononic Comb Enhanced Atomic Clock", and its corresponding non-provisional U.S. patent application Ser. No. 17/567,034, filed 31 Dec. 2021, and having the same title as its related provisional application, the disclosure of which is hereby incorporated herein by reference in its entirety.

This application is also related to the technology disclosed in U.S. Provisional Patent Application Ser. No. 63/070,522 filed 26 Aug. 2020 and entitled "Phononic Comb Enhanced Capacitive Inductive Sensor" and its corresponding non-provisional U.S. patent application Ser. No. 17/347,403, filed 14 Jun. 2021, and having the same title as its related provisional application, the disclosures of which are hereby incorporated herein by reference in their entireties.

STATEMENT REGARDING FEDERALLY SPONSORED RESEARCH OR DEVELOPMENT

This disclosure was made with government support under U.S. government contract NRO000-'21-C-0105 and therefore the U.S. government has certain rights in this disclosure.

TECHNICAL FIELD

The present disclosure is related to a nonlinear resonator system, and snore specifically, a nonlinear resonator system for generating a low noise phononic frequency comb and a method thereof.

BACKGROUND

As described in U.S. Provisional Patent Application Ser. No. 62/904,052, filed 23 Sep. 2019, and entitled "Enhanced Stability Oscillators using a Phononic Comb", and to its related non-provisional patent application Serial No. 16/932, 455, filed 17 Jul. 2020, and having the same title as its related provisional application, phononic frequency combs may be useful for clock, sensor, radar, or communication network applications.

In previous demonstrations of phononic frequency comb generation, a single resonator with multiple internal modes, such as fundamental, anharmonic, flexural, extensional, or torsional modes, is disclosed to couple nonlinearly with the drive frequency to produce phononic comb. See, for example, (i) Ganesari, Adarsh et al., "Phononic frequency comb via three-mode parametric resonance" *Applied Physics Letters* 112.2 (2018): 021906; (ii) Park, Mingyo and Azadeh Ansari, "Phononic frequency combs in stand-alone piezoelectric resonators" 2018 *IEEE International Frequency Control Symposium (IFCS), IEEE,* 2018; and (iii) Kubena, R. L., Wall, W. S., Koehl, J., and Joyce, R. J., "Phononic Comb Generation in High-Q) Quartz Resonators," *Applied Physics Letters,* 116, 053501, Feb. 4, 2020.

The theoretical basis of phononic frequency comb generation is currently being developed. See (i) R. L. Kubena., W. S, Wall, J. Kuehl, and R. J. Joyce, "Phononic Comb Generation in High-Q Quartz Resonators," *Applied Physics Letters,* 116, 053501, Feb. 4, 2020; (ii) Kubena, R. L., Yong, Y. K, Wall, W. S., Kuehl, J., & Joyce, R. J., "Nonlinear Analysis of Phononic Comb Generation in High-Q Quartz Resonators," in 2020 *Joint Conference of the IEEE International Frequency Control Symposium and International Symposium on Applications of Ferroelectrics (IFCS-ISAF)* pp. 1-5 July 2020; (iii) R. L. Kubena, W. S. Wall, J. Kuehl, and R. J. Joyce, "Nonlinear Analysis of Phononic Comb Generation in High-Q Quartz Resonators," *IEEE* 2020 *Freq. Control Sym., Keystone, Co., Jul.* 19-23, 2020; (iv) W. S. Wall & R. L. Kubena, "Phase Noise Transfer in High-Q Quartz Phononic Frequency Combs", *IEEE Ultrasonics Symposium, Las Vegas, NV,* September 2020; (v) Y. K Yong, R. L. Kubena, and W. S. Wall, "Nonlinear 2D Modeling of Phononic Frequency Comb Generation in Quartz AT-cut Resonators," 2021 *IEEE Ultrasonics Sym. (IUS),* Sep. 12-15, 2021; (vi) Qi, Z., Menyuk, C. R, Gorman, J. J., & Ganesan, A., "Existence conditions for phononic frequency combs", *Applied Physics Letters,* 117(18), 183503, 2020; (vii) Czaplewski, David A., Shaw, Steven W., Shoshani, Oriel, Dykman, Mark L., and Lopez, Daniel, "Frequency Comb Generation In A Nonlinear Resonator Through Mode Coupling Using A Single Tone Driving Signal" in *Solid-State Sensors, Actuators and Microsystems Workshop Hilton Head Island, South Carolina*, Jun. 3-7, 2018; and (viii) Singh, R., Sarkar, A., Curia C., Nicholl R., Chakraborty, S. Bolotin, K., and Ghosh, S., "Giant Tunable Mechanical Noi linearity in Graphene-Silicon Nitride Hybrid Resonator" published 23 Jun. 2020, see arxiv.org/pdf/1904.01613,pdf. See also: Y. K. Yong, W. Wall, D. Kirby, and R. Kubena, "An Averaging Method for Phase Noise Studies of Quartz Phononic Frequency Combs," IEEE Ultrasonics Transactions, 2023.

It is thought that t o modes couple nonlinearly in a resonator driven with a sufficiently energetic drive signal tone to produce the comb.

In this disclosure, a description is provided of a new structure or system of nonlinear resonators, coupled through a nonlinear element, to produce frequency combs with teeth capable of exhibiting less noise than an input drive tone supplied to the system. In a preferred embodiment, these nonlinear resonators can be connected to one another in parallel and comprise each a traditional quartz crystal resonator connected in series to a resistor and a pair of opposing varactor diodes, i.e., two varactors in an opposing series. A third pair of opposing varactors located after the parallel junction connecting the two nonlinear resonators can be configured to couple the two modes together and allow for comb formation. Unlike previous implementations of phononic frequency combs, this new topology can afford greater control over the nonlinear resonators and coupling parameters, hopefully without needing to design and fabricate custom resonators. As such, commercial off the shelf resonators may possibly be utilized. Also, it has been usual for a non-linear resonator to be driven sufficiently energetically to generate the comb. In the technology disclosed herein, additional nonlinearity can be produced in the varactors not necessarily in a resonator, so the non-linear resonator may not need to be driven as energetically as done heretofore. Other embodiments are also provided in this disclosure, which include 1) a varactor biasing scheme to select particular regions of the varactor's CV curves, 2) replacing one of the crystal resonators with a traditional LC circuit, 3) replacing all three or some portion of the varactor pairs with active nonlinear elements such as amplifiers operated in saturation, and 4) using the crystal resonators in their nonlinear regime without a varactor pair in each branch but with a varactor pair for nonlinear coupling.

Previous experiments of phononic frequency combs in AT-cut quartz resonators have shown that comb teeth with very high slope can be generated and used to produce output frequencies with substantially less noise than the input drive which is used to generate them. Recent numerical analysis and experimental data suggests that one of the modes contributing to these prior formations of phononic frequency combs is likely a spurious mode which has undesirable reliability and thermal sensitivity. It is to be noted that a spurious mode can be either a flexural, torsional, extensional, or some combination of these modes interacting with the fundamental mode. Further, these previous demonstrations relied on the inherent modal configuration in Commercial Off the Shelf (COTS) resonators and provided very little means to optimize the configuration of the resonator to generate specific features in the resulting phononic frequency comb. U.S. Provisional Patent Application No. 63/222,880 filed 16 Jul. 2021 and entitled "Acoustically Coupled Dual Resonators for Phononic Frequency Comb Generation" describes a method of acoustically coupling two resonators on a common substrate to produce a pair of modes which can be used to produce phononic frequency combs, but does not describe a method of coupling two packaged resonators and/or ones on different substrates or in different materials.

To address these issues, a new architecture is proposed herein comprising two coupled resonators connected in an electrical circuit each with linear and nonlinear properties preferably tailored to produce optimally low noise comb teeth.

Reference oscillators, such as atomic clocks and conventional crystal oscillators (VCXOs, TCXOs, and OCXOs) are used for example in radar systems, communication networks, and wideband receivers. As radar and communication links might move to higher frequency mm-wave operation, the phase noise of the local oscillator tends to limit channel capacity, range, bandwidth, and bit error rate (BER). For a 20 dB reduction in phase noise, the channel capacity of high-data-rate communication networks can improve by 100×, the range of wideband radar systems can improve by 3×, and the bandwidth of EW receivers can improve by 10×. For wireless communication, local frequency stability and timing accuracy improvements of >10× (ADEV improvements from $10^{-11}$ to $10^{-12}$ and timing accuracy from 1 μs to <100 ns) are needed to move from 4G technology to future 6G systems, in addition, as frequencies increase, a higher density of low c-SWaP clocks is needed for local timing nodes due to limited penetration of signals through buildings and natural barriers. There is also a need for better timing synchronization in GPS denied environments. Thus, there is both a commercial and military creed for improved low cost, small, and low phase noise clocks. This new resonator design for the nonlinear element could be used with the various inventions discussed in the patent applications referenced above.

BRIEF DESCRIPTION OF THE INVENTION

This disclosure teaches a method for coupling two independent resonators via a nonlinear element to generate phononic frequency combs as well as methods to adjust the nonlinearity of each resonator to optimize the stability of particular teeth in the comb. Although the technology disclosed in U.S. Provisional Patent Application No. 63/222, 880 filed 16 Jul. 2021 and entitled "Acoustically Coupled Dual Resonators for Phononic Frequency Comb Generation" teaches a method of coupling two resonators to produce a pair of modes capable of generating phononic frequency combs, it does not teach how to couple two resonators on different substrates or how to independently adjust the nonlinear coupling between the two resonators.

BRIEF DESCRIPTION OF THE DRAWINGS

The patent or application file contains at least one drawing executed in color. Copies of this patent or patent application publication with color drawing(s) will be provided by the U.S. Patent Office upon request and payment of the necessary fee.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this Specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Figure 1:
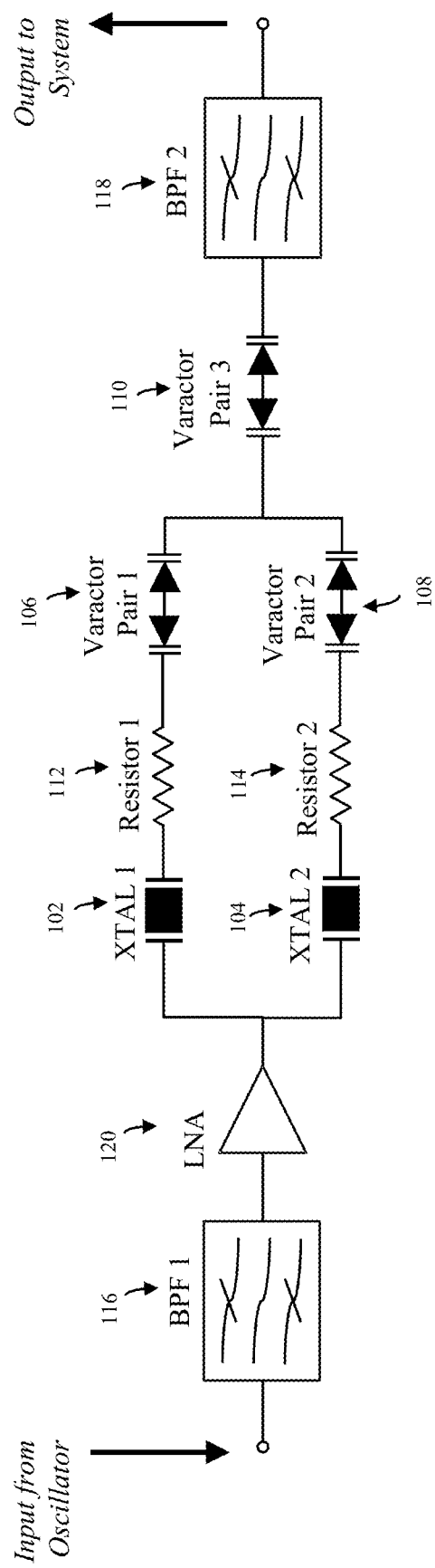
FIG. 1 is a block circuit diagram of a preferred embodiment of a Nonlinear Resonator System for Low Noise Phononic Comb Generation.
Figure 6:
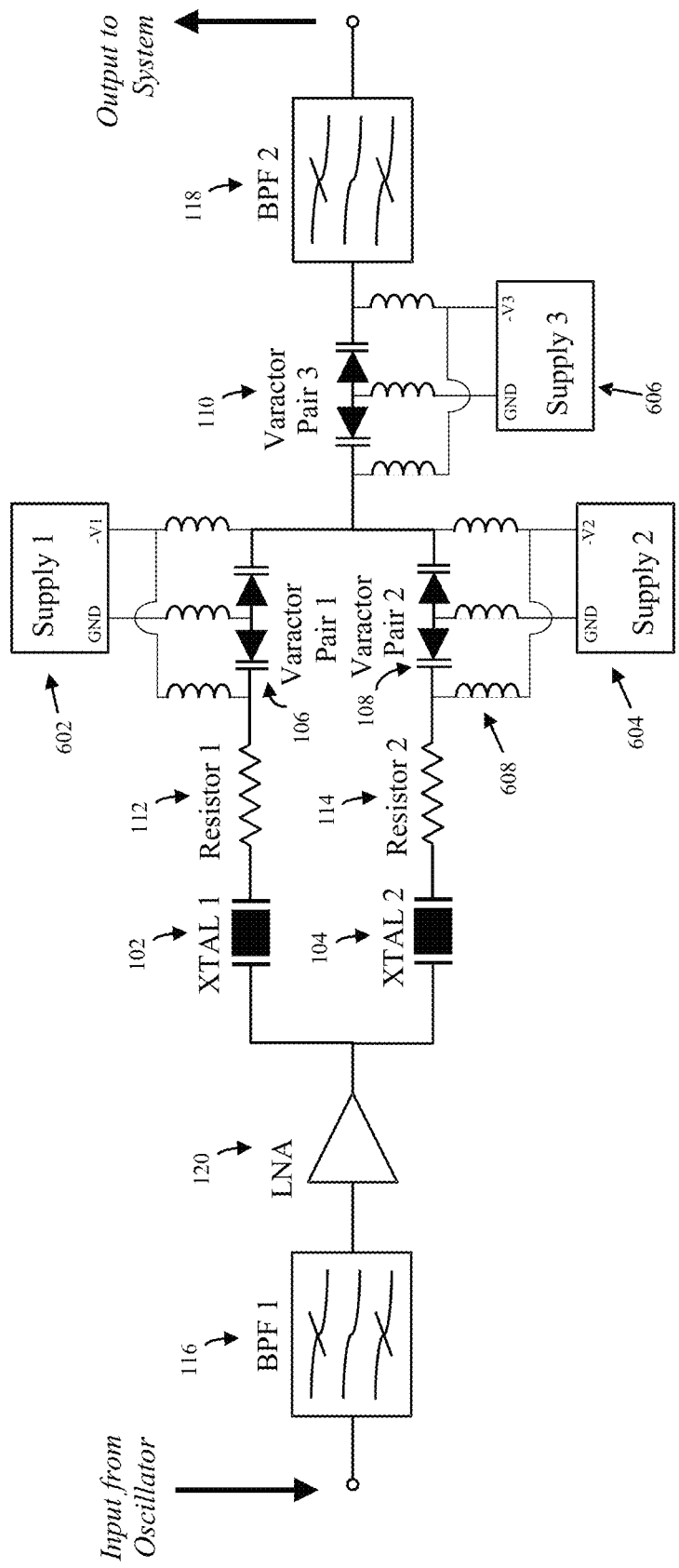
FIG. 6 is a block circuit diagram of an alternative embodiment in which biasing circuits are added to each varactor pair to tune their nonlinear behavior.
Figure 7:
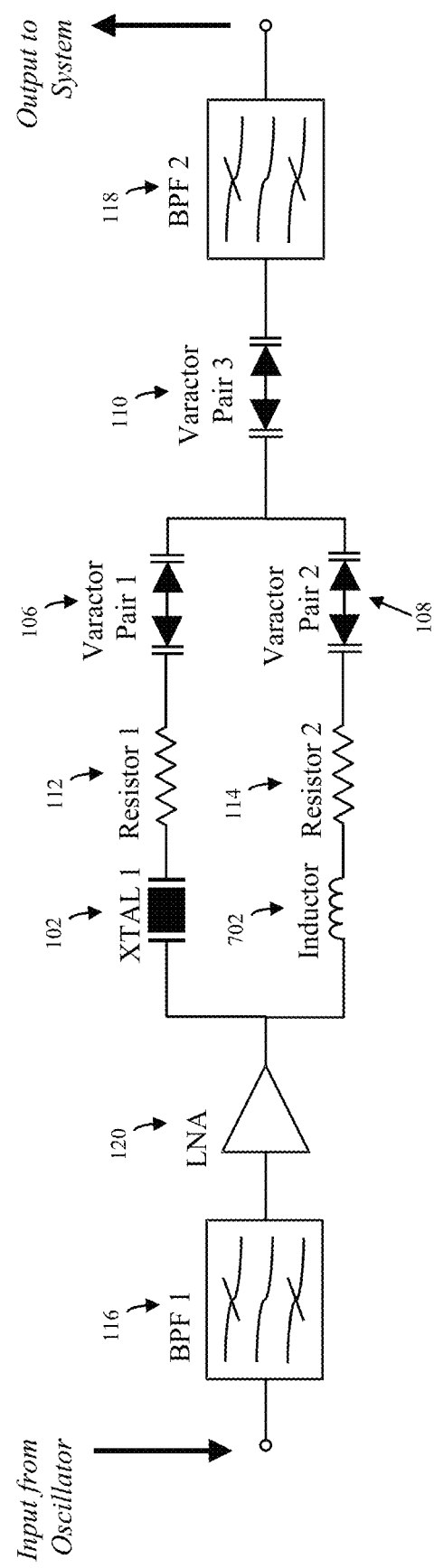
FIG. 7 is a block circuit diagram of an alternative embodiment in which one or more of the crystal resonators are replaced with an inductor or conventional RLC resonator.

As detailed hereafter with respect for example to FIGS. 1, 6, 7, embodiments of a phononic frequency comb generator according to embodiments of this presentation comprise two nonlinear resonators arranged in a parallel circuit arrangement, itself connected in series with a nonlinear element; wherein an input bandpass filter can be coupled to an input of the parallel circuit arrangement, the input bandpass filter being configured to have a center frequency near that of a drive frequency used to generate the phononic frequency comb. The two nonlinear resonators can be arranged in two branches of a parallel circuit arrangement whose output is connected in series with the nonlinear element, and at least one of the two nonlinear resonators in one of the two branches can comprise a mechanical resonator connected in series with at least a pair of varactors.

In yet another embodiment, the at least one of the two nonlinear resonators in one of the two branches can further comprise a resistor connected in series with the mechanical resonator and with the at least a pair of varactors, the resistor allowing a damping coefficient of the resonance to be increased independently of a resonance of the other one of the two branches.

Figure 8:
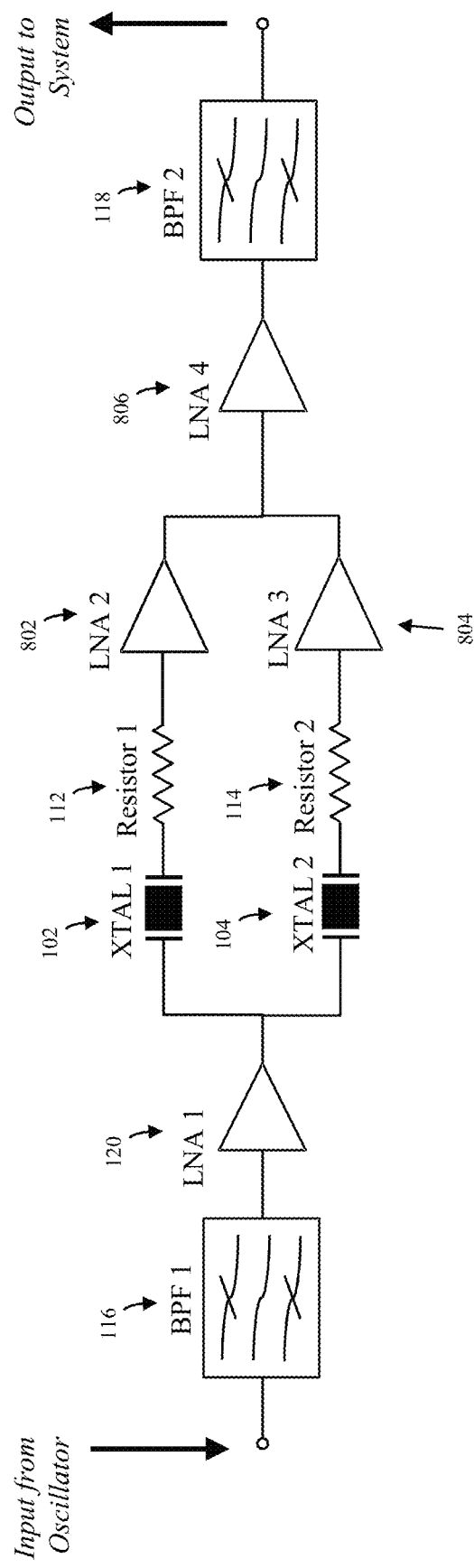
FIG. 8 is a block circuit diagram of an alternative embodiment in which one or more of the varactor pairs are replaced with an active nonlinear element such as an amplifier operated in saturation.

As detailed hereafter with respect for example to FIG. 8, the at least one of the two nonlinear resonators in one of the two branches can comprise a mechanical resonator connected in series with an amplifying circuit and the at least one of the two nonlinear resonators in one of the two branches can further comprise a resistor connected in series with the mechanical resonator and with the amplifying circuit, the resistor allowing a damping coefficient of the resonance increased independently of a resonance of the other one of the two branches.

As shown in FIG. 1, an apparatus for generating a phononic frequency comb according to an embodiment of this technology comprises a pair of crystal resonators 102, 104 (denoted on FIG. 1 as XTAL 1 and XTAL 2) electrically connected to one another in a parallel circuit configuration. This parallel electrical connection can be achieved by any method suitable to provide sufficiently low electrical impedance between the terminals of the two devices and can include but is not limited to soldering wires between the two resonators 102, 104 or soldering each resonator to a PCB with preformed traces for generating the appropriate electrical connections. An optional resistor 112, 114 (for example Resistors 1 and 2 of FIG. 1) and an optional pair of opposing varactor 106, 108 (for example Varactor Pairs 1 and 2 of FIG. 1) can be electrically connected in series to each resonator 102, 104 (XTAL 1 and XTAL 2). The addition of a resistor 112, 114 (such as optional Resistors 1 and 2 of FIG. 1) allows the damping coefficient of the resonance of the resonator in that particular parallel branch to be increased independently of the resonance of the resonator in the parallel branch. When operated in reverse bias, the capacitance of a varactor diode varies nonlinearly with an input voltage, however in forward bias the varactor will behave like a traditional PN junction diode, exhibiting a typical diode IV curve. To avoid conducting in a forward bias condition, two varactors can be used as a pair in an opposing polarity series configuration ensuring that the impedance across the varactor diode pair is exhibited by the varactor diodes in reverse bias regardless of the polarity of the incident voltage. A third opposing varactor diode pair 110 (for example Varactor Pair 3 of FIG. 1) can be connected in series at the parallel junction between the two aforementioned resonators 102, 104 (XTAL 1 and XTAL 2). Each parallel path can comprise a nonlinear resonance (which is produced by a resonator XTAL 1 or XTAL 2 each in combination with a series connected Varactor Pairs 1 or 2) which can then be summed together or mixed to produce a comb.

The third Varactor Pair 3 110 can act as a coupling element, enabling nonlinear mixing between the two resonances and ultimately formation of phononic frequency combs. Any of the varactors in these three pairs can be normal varactors or temperature compensated varactors to ensure the thermal stability of the system so that it is not impacted by temperature variations in the varactors.

As detailed hereafter with respect for example to FIGS. 1, 6, 7, 8, 9, in embodiments of this presentation, the two nonlinear resonators 102, 104 can form a parallel circuit arrangement, itself connected in series with the nonlinear element; wherein an output bandpass filter 118 is coupled to an output of the nonlinear element (110, 806, 902), wherein the output bandpass filter 118 is configured to have a bandwidth less than a tooth spacing in the comb. According to embodiments of this presentation, bandpass filters can be placed at the input (for example BFP 1/116) and output (for example BFP 2/118) of the system. The bandpass filter 116 (BFP 1) at the input of the system can be configured to have a center frequency near that of the drive frequency ("Input from Oscillator") used to generate the phononic frequency comb. The bandwidth of this filter is preferably designed to be sufficiently narrow such that the rejection band of the filter can overlap with the frequency of the stable comb tooth to be isolated at the output of the system. The second filter 118 (BFP 2) at the output of the system can preferably be designed to isolate the stable comb tooth and reject the drive frequency and all other teeth generated during the comb formation process. The bandwidth of this second or output filter 118 (BFP 2) can be designed to be sufficiently less than the tooth spacing in the comb, This output filter 118 (BFP 2) can be replaced by a phase locked loop of sufficiently narrow bandwidth, if desired. After the bandpass filter 116 (BPF 1) at the input of the system, a low noise amplifier 120 (LNA 1) can be connected in series. This amplifying element allows the power of the drive signal to be adjusted (if needed) after filtering to meet the specific power require rents needed for comb formation, for example, in the event that the bandpass filter 116 (BFP 1) is not rated to handle this power level at its input.

Figure 2:
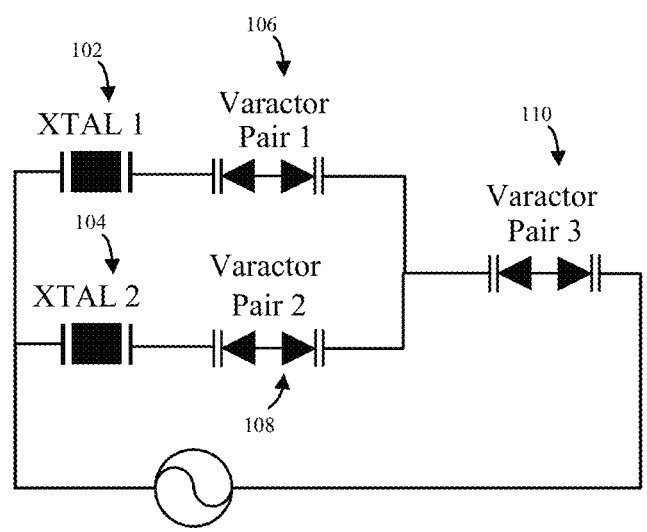
FIG. 2 is a simplified and reduced block circuit diagram version of FIG. 1.

To better observe the behavior of the system described with reference to FIG. 1, one may consider a simplified circuit shown in FIG. 2. The reader is also directed to the previously cited reference (iii): R. L. Kubena, W. S. Wall, J. Koehl, and R. J. Joyce, "Nonlinear Analysis of Phononic Comb Generation in High-Q Quartz Resonators," *IEEE* 2020 *Freq. Control Sim., Keystone, Co.*, Jul. 19-23, 2020. As shown in FIG. 2, this simplified circuit can comprise a first parallel circuit including two crystal resonators 102, 104 each connected in series to a pair of opposing varactor diodes 106, 108; the parallel circuit connected in series to a third pair of opposing varactor diodes 110 at the junction of the two parallel branches. Assuming that the response of all three varactor diodes can be represented as a purely cubic nonlinearity, then the following set of differential equations can be derived.

$$L_{1,A}\ddot{q}_A + R_{1,A}\dot{q}_A + \frac{1}{C_{1,A}}q_A + \gamma_A q_A^3 +$$
$$\gamma_{AB}(q_A^3 + 3q_A^2 q_B + 3q_B^2 q_A + q_B^3) = V\omega_D \cos\omega_D t$$
Eqn. (1)

$$L_{1,B}\ddot{q}_B + R_{1,B}\dot{q}_B + \frac{1}{C_{1,B}}q_B + \gamma_B q_B^3 +$$
$$\gamma_{AB}(q_A^3 + 3q_A^2 q_B + 3q_B^2 q_A + q_B^3) = V\omega_D \cos\omega_D t$$
Eqn. (2)

where $q_A$ & $q_B$ are the charge contributions from resonance A & B, respectively, $L_{1,A}$, $R_{1,A}$, and $C_{1,A}$ are the motional inductance, motional resistance, and motional capacitance of resonator 102 or crystal 1, respectively, $L_{1,B}$, $R_{1,B}$, and $C_{1,B}$ are the motional inductance, motional resistance, and motional capacitance of resonator 104 or crystal 2, respectively, $\gamma_A$, $\gamma_B$, and $\gamma_{AB}$ are the cubic nonlinear coefficients associated with varactor pairs 106, 108, 110, respectively, V is the drive voltage of the circuit and ω is the drive frequency of the circuit.

HRL Laboratories of Malibu, CA has developed the following set of coupled differential equations to model the formation and dynamics of phononic frequency combs in quartz AT-cut resonators (which equations are explained in some detail in reference (iii):, but the reader should note that Eqn. (3) and (4) set forth below are generalized compared to that found in reference iii): and the coefficients have been made arbitrary for the purpose of modeling), $$\ddot{A}+\beta_1\dot{A}+\omega_0^2 A+G_{11}A|A|^2+G_{12}A|B|^2=F\cos\omega_D t$$
Eqn. (3)

$$\ddot{B}+\beta_2\dot{B}+\omega_{00}^2 B+G_{22}B|B|^2+G_{21}B|A|^2=F\cos\omega_D t$$
Eqn. (4)

where A & B are the charge contributions from the resonators' mode A & B respectively, $\beta_1$ and $\beta_2$ are the clamping coefficients associated with mode A & B respectively, $\omega_0$ and $\omega_{00}$ are the natural frequencies associated with mode A & B respectively, $G_A$, $G_B$, and $G_{AB}$ are the duffing coefficients associated with mode A, mode B, and the nonlinear coupling between modes A & B respectively, F is the drive amplitude, and $\omega_D$ is the drive frequency. It has been observed (see reference (iii):) that in order to generate phononic frequency combs with a stable comb tooth, a large disparity between the duffing and cross-duffing coefficients of the two modes is required (e.g. $G_{11}=G_{12}\gg G_{22}=G_{21}$).

The inventors noted that it is not possible to exactly replicate the above condition with the existing models of a single resonator (i.e. Eqn. (3) and (4)), but that something approximately close can be generated in the case where $G_{12}=G_{21}=G_{22}\ll G_{11}$.

In regard to Eqn. (1) and this would correspond to the case where $\gamma_B=0$ & $\gamma_{AB}\ll\gamma_A$.

Due to the discrepancy in terms between the two equations, simulating this scenario for equations Eqn. (3) and (4) does not provide a direct analog to the behavior of equations Eqn. (1) and (2) but it is expected to provide something similar. To that end, solutions to Eqn, (3) and (4) were calculated numerically in MATLAB using the Kryloy-Bogoliuboy approximation and the following set of parameters ($f_0$=100 [MHz], $f_{00}$=100. 205 [MHz], $f_D$=100. 136 [MHz], V=4.74 [V], β=23174 [Hz], γ=1.1e13 [Pa], $\beta_1$=9β, $\beta_2$=1β, $G_{11}$=120γ, $G_{12}$=$G_{22}$=$G_{21}$=6γ).

Figure 3:
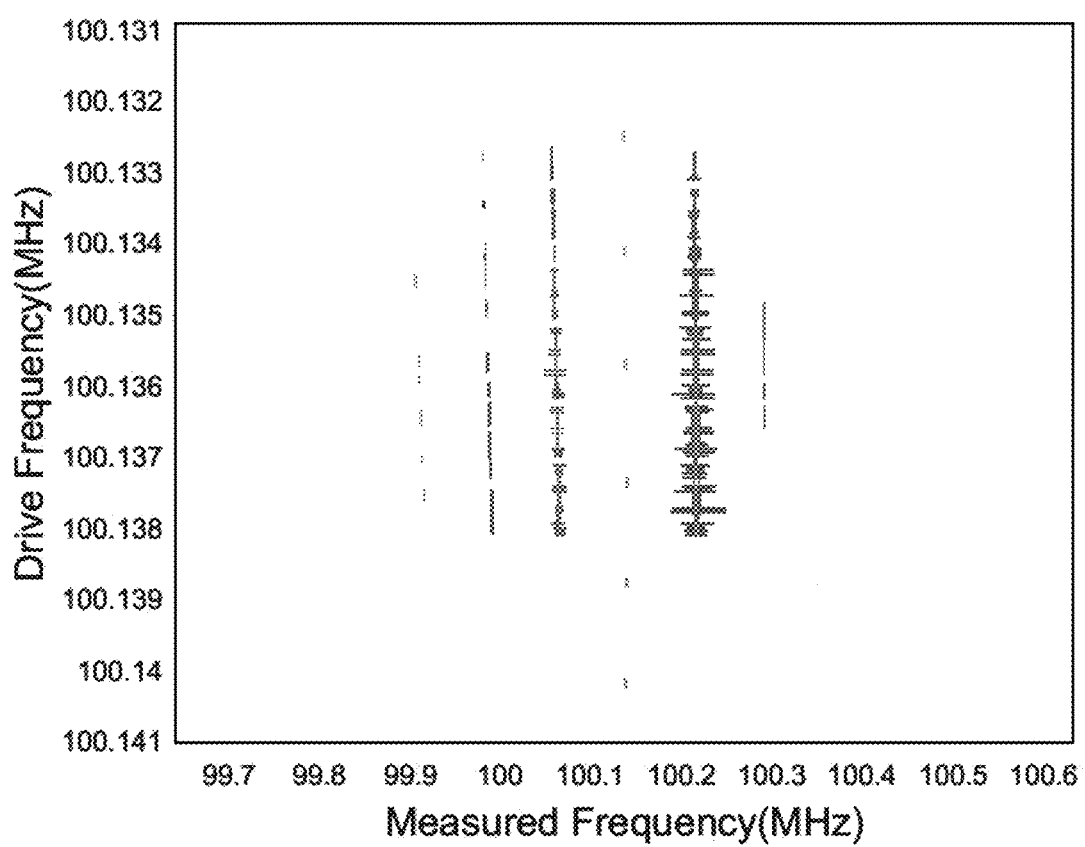
FIG. 3 is a waterfall plot from a two-mode AT cut quartz simulation believed to have a behavior similar to the circuit in FIG. 2.
Figure 4:
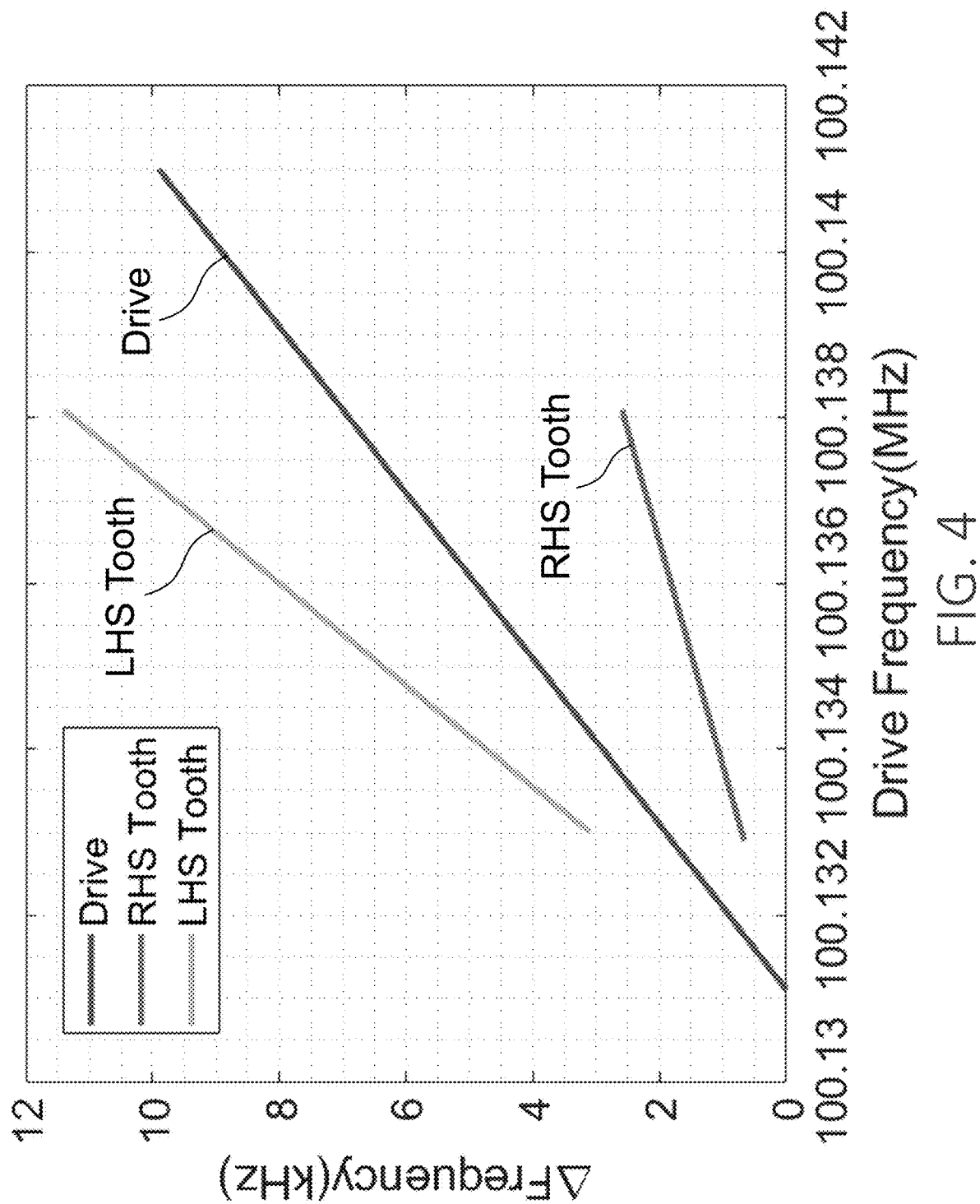
FIG. 4 is a graph showing drive frequency dependence of comb teeth frequencies compared to drive frequency.
Figure 5:
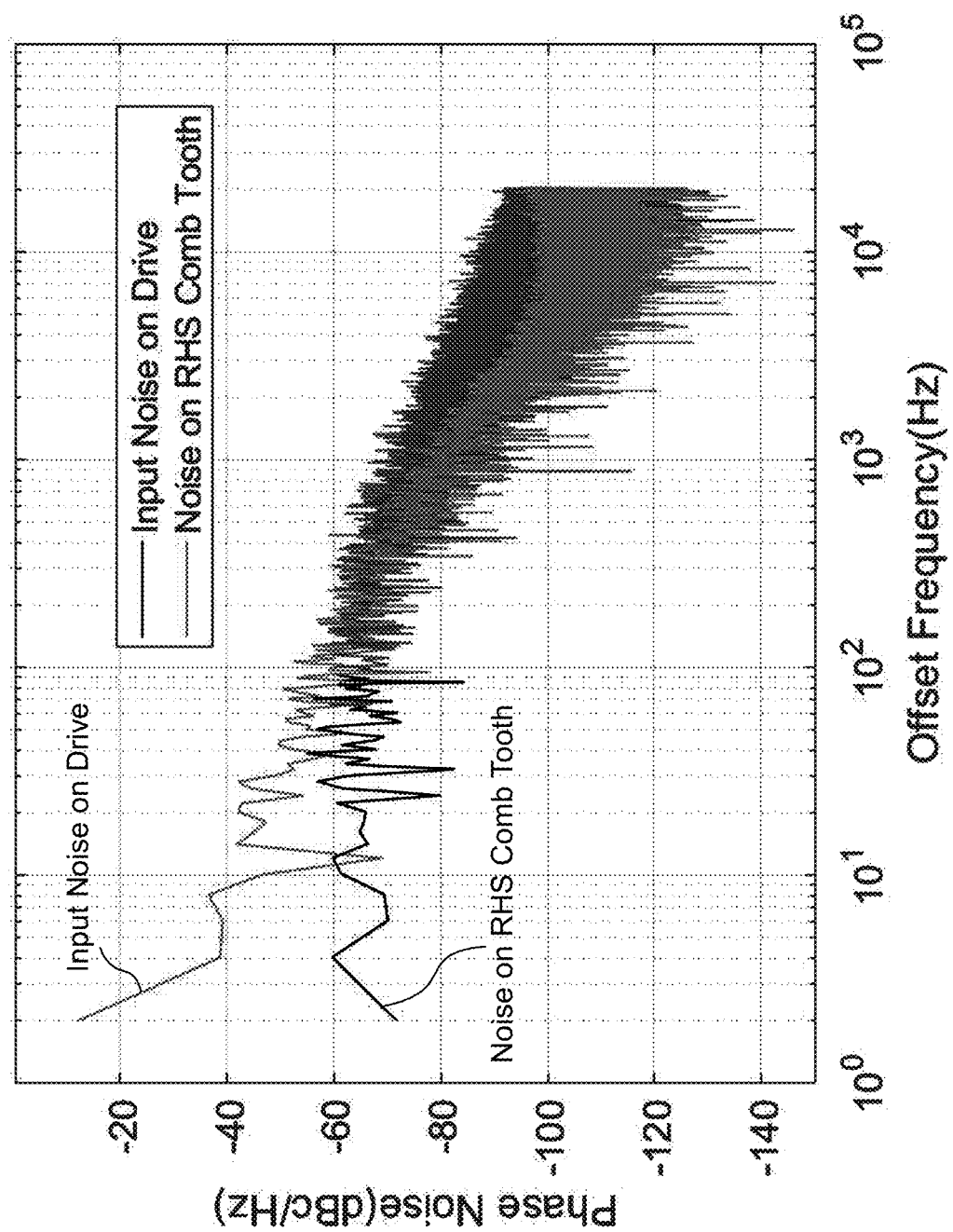
FIG. 5 is a graph showing reduction in single sideband noise achieved on RHS comb tooth.

FIG. 3 shows the frequency spectrum across the electrodes of the resonator as a function of frequency for various drive frequencies. As can be seen in FIG. 4., the tooth immediately higher in frequency than the drive (i.e. the Right Hand Side (RHS) tooth) exhibits a much smaller change in frequency than the drive. When a phase noise is applied to the drive signal, this smaller frequency deviation can correspond. to a reduction in phase noise on that tooth (see FIG. 5).

By varying the ratios of G11, G22, G12, and G21 and the damping ratios betal and beta 2, one can show with the numerical simulations of Eqn (3) and (4) that the sensitivity of the teeth to drive frequency variations can be varied. In the examples for FIG. 3, the inventors used beta 1=9×beta 2. This ratio was varied to obtain the results in FIGS. 3 and 4.

A biasing network can be connected across the at least a varactor or the at least a varactor pair to select a control voltage (CV) of the at least a varactor or the at least a varactor pair. In an embodiment such as shown in FIG. 6, the circuit of FIG. 1 can be modified by adding biasing networks 602, 604, 606 (for example Supply 1, 2 and 3) connected across each varactor pair 106, 108, 110, respectively, in order to select on which part of the varactor's CV curve the circuit operates. To avoid coupling the RF signals at the varactor pairs to the biasing networks, at least one inductor 608 can be placed on each bias line (e.g. between each node of each varactor pair and an associated bias node) to act as low pass filter, preventing such RF coupling. Thus, in such embodiments the biasing network 602, 604, 606 is connected to the at least a varactor or the at least a varactor pair using at least one inductor 608.

According to embodiments of this presentation, one of the two nonlinear resonators can comprise an RLC resonator, and said RLC resonator can comprise a pair of varactors in opposing series, a resistance and an inductor resonant at the resonator frequency with a capacitance of said pair of varactors in opposing series. In FIG. 7, a single inductor 702 is shown and assumed to be selected such that it is resonant at the desired frequency with the capacitance of the corresponding varactor pair 108. However, according to other embodiments of this presentation, an entire RLC circuit (not shown) can also be connected in series with the varactor pair.

In still yet another embodiment shown in FIG. 8, the varactor pairs can be replaced with nonlinear active elements, such as amplifiers 802, 804, 806 operated in saturation, although there may be many different types of active elements which might achieve the desired effect.

Figure 9:
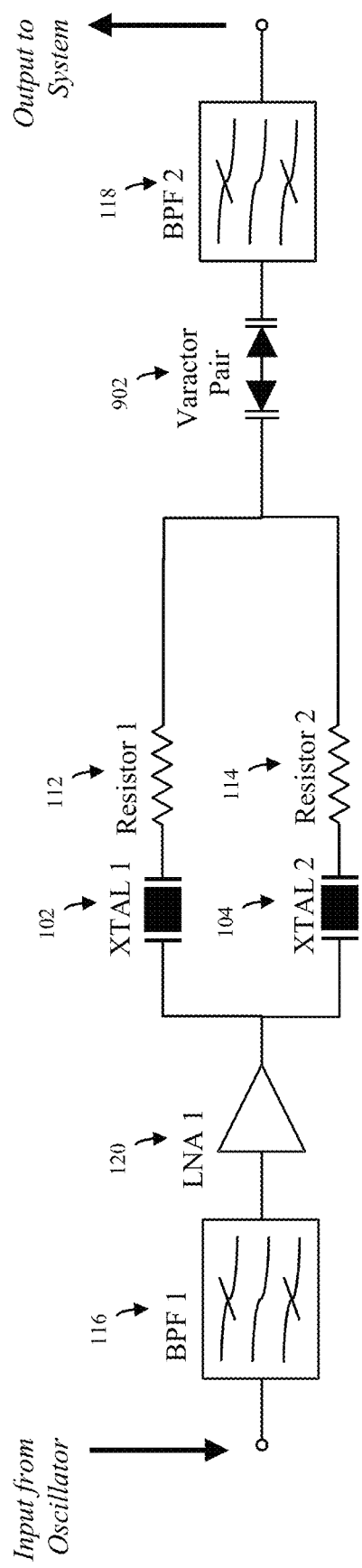
FIG. 9 is a block circuit diagram of an alternative embodiment in which the varactor pairs in one or more of the parallel branches are removed.

In yet another embodiment as shown in FIG. 9, one or both of the varactor pairs 106 and/or 108 in FIG. 1 in the parallel circuit can be removed, while the output of the parallel circuit is connected in series with a varactor pair 902. The varactor pairs in the parallel circuits are not required for the resonators to exhibit non-linear behavior if the resonators can be driven sufficiently energetically. But for high Q mechanical resonators, it might be easier (requiring lower voltage, for example) to produce the nonlinearity using a varactor diode in combination with the resonator. In addition, if one requires specific ratios of the nonlinear coefficients to produce the desired teeth characteristics, it might be easier to use external elements (here for example the varactor pairs) than using a single mechanical resonator. This writing further discloses the following implementations.

A first implementation of the technology herein comprises a method for generating a phononic frequency comb, comprising: coupling two nonlinear resonators via a nonlinear element.

A further implementation of any of the preceding or following implementations comprises embodiments where the nonlinear element comprises at least a varactor or at least a varactor pair.

A further implementation of any of the preceding or following implementations comprises embodiments There a biasing network is connected across the at least a varactor or the at least a varactor pair to select a control voltage (CV) of the at least a varactor or the at least a varactor pair.

A further implementation of any of the preceding or following implementations comprises embodiments where the biasing network is connected to the at least a varactor or the at least a varactor pair using at least one inductor.

A further implementation of any of the preceding or following implementations comprises embodiments where one of the two nonlinear resonators comprises an RLC resonator, and said RLC resonator comprises a pair of varactors in opposing series, a resistance and an inductor resonant at the resonator frequency with a capacitance of said pair of varactors in opposing series.

A further implementation of any of the preceding or following implementations comprises embodiments where the nonlinear element is a nonlinear active element; wherein said nonlinear active element comprises an amplifier operated in saturation.

A further implementation of any of the preceding or following implementations comprises embodiments where the at least a varactor pair comprises two varactors in an opposing series.

A further implementation of any of the preceding or following implementations comprises embodiments There the at least a varactor pair comprises at least one temperature compensated varactor.

A further implementation of any of the preceding or following implementations comprises embodiments where the two nonlinear resonators form a parallel circuit arrangement, itself connected in series with the nonlinear element; and wherein an input bandpass filter is coupled to an input of the parallel circuit arrangement, and the input bandpass filter is configured to have a center frequency near that of a drive frequency used to generate the phononic frequency comb.

A further implementation of any of the preceding or following implementations comprises embodiments where the two nonlinear resonators form a parallel circuit arrangement, itself connected in series with the nonlinear element; and wherein an output bandpass filter is coupled to an output of the nonlinear element, and the output bandpass filter is configured to have a bandwidth less than a tooth spacing in the comb.

A further implementation of a of he preceding or following implementations comprises embodiments where the output bandpass filter comprises a phase locked loop.

A further implementation of any of the preceding or following implementations comprises embodiments There the two nonlinear resonators are arranged in two branches of a parallel circuit arrangement whose output is connected in series with the nonlinear element.

A further implementation of any of the preceding or following implementations comprises embodiments where at least one of the two nonlinear resonators in one of the two branches comprises a mechanical resonator connected in series with at least a pair of varactors.

A further implementation of any of the preceding or following implementations comprises embodiments here the at least one of the two nonlinear resonators in one of the two branches further comprises a resistor connected in series with the mechanical resonator and with the at least a pair of varactors, the resistor allowing a damping coefficient of the resonance increased independently of a resonance of the other one of the two branches.

A further implementation of any of the preceding or following implementations comprises embodiments where at least one of the two nonlinear resonators in one of the two branches comprises a mechanical resonator connected in series with an amplifying circuit.

A further implementations of any of the preceding or following implementations comprises embodiments where the at least one of the two nonlinear resonators in one of the two branches further comprises a resistor connected in series with the mechanical resonator and with the amplifying circuit, the resistor allowing a damping coefficient of the resonance increased independently of a resonance of the other one of the two branches.

A second implementation of the technology comprises an apparatus for generating a phononic frequency comb, comprising two nonlinear resonators coupled via a nonlinear element.

A further implementation of any of the preceding or following implementations comprises embodiments here the nonlinear element comprises at least a varactor or at least a varactor pair.

A further implementation of any of the preceding or following implementations comprises embodiments There a biasing network is connected across the at least a varactor or the at least a varactor pair to select a control voltage (CV) of the at least a varactor or the at least a varactor pair.

A further implementation of any of the preceding or following implementations comprises embodiments where the biasing network is connected to the at least a varactor or the at least a varactor pair using at least one inductor.

A further implementation of any of the preceding or following implementations comprises embodiments where one of the two nonlinear resonators comprises an RLC resonator, and said RLC resonator comprises a pair of varactors in opposing series, a resistance and an inductor resonant at the resonator frequency with a capacitance of said pair of varactors in opposing series.

A further implementation of any of the preceding or following implementations comprises embodiments where the nonlinear element is a nonlinear active element; wherein said nonlinear active element comprises an amplifier operated in saturation.

A further implementation of any of the preceding or following implementations comprises embodiments where the at least a varactor pair comprises two varactors in an opposing series.

A further implementation of any of the preceding or following implementations comprises embodiments where the at least a varactor pair comprises at least one temperature compensated varactor.

A further implementation of any of the preceding or following implementations comprises embodiments where the two nonlinear resonators form a parallel circuit arrangement, itself connected in series with the nonlinear element; wherein an input bandpass filter is coupled to an input of the parallel circuit arrangement, and wherein the input bandpass filter is configured to have a center frequency near that of a drive frequency used to generate the phononic frequency comb.

A further implementation of any of the preceding or following implementations comprises embodiments where the two nonlinear resonators form a parallel circuit arrangement, itself connected in series with the nonlinear element; wherein an output bandpass filter is coupled to an output of the nonlinear element, and wherein the output bandpass filter is configured to have a bandwidth less than a tooth spacing in the comb.

A further implementation of any of the preceding or following implementations comprises embodiments where the output bandpass filter comprises a phase locked loop.

A further implementation of any of the preceding or following implementations comprises embodiments where the two nonlinear resonators are arranged in two branches of a parallel circuit arrangement whose output is connected in series with the nonlinear element.

A further implementation of any of the preceding or following implementations comprises embodiments where at least one of the two nonlinear resonators in one of the two branches comprises a mechanical resonator connected in series with at least a pair of varactors.

A further implementation of any of the preceding or following implementations comprises embodiments where the at least one of the two nonlinear resonators in one of the two branches further comprises a resistor connected in series with the mechanical resonator and with the at least a pair of varactors, the resistor allowing a damping coefficient of the resonance increased independently of a resonance of the other one of the two branches.

A further implementation of any of the preceding or following implementations comprises embodiments where the at least one of the two nonlinear resonators in one of the two branches further comprises an amplifying circuit.

A further implementation of any of the preceding or following implementations comprises embodiments where the two nonlinear resonators each further comprise a resistor connected in series with the mechanical resonator in one of said two branches and with the at least a pair of varactors, the resistor allowing a damping coefficient of the resonance increased independently of a resonance of the other one of said two branches.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art and no limitation should he implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

As used in this document, "each" refers to each member of a set or each member of a subset of a set. Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. Changes and modifications may be made without departing from and should be considered within the scope and spirit of the invention as disclosed herein.

What is claimed is:

1. A method for generating a phononic frequency comb, comprising: coupling two nonlinear resonators via a nonlinear element.

2. The method of claim 1, wherein the nonlinear element comprises at least a varactor or at least a varactor pair.

3. The method of claim 1, wherein the nonlinear element is a nonlinear active element; wherein said nonlinear active element comprises an amplifier operated in saturation.

4. The method of claim 2, wherein the at least a varactor pair comprises two varactors in an opposing series.

5. The method of claim 2, wherein the at least a varactor or the at least a varactor pair comprises at least one temperature compensated varactor.

6. The method of claim 1, wherein the two nonlinear resonators form a parallel circuit arrangement, itself connected in series with the nonlinear element; wherein an input bandpass filter is coupled to an input of the parallel circuit arrangement, and wherein the input bandpass filter is configured to have a center frequency near that of a drive frequency used to generate the phononic frequency comb.

7. The method of claim 1, wherein the two nonlinear resonators form a parallel circuit arrangement, itself connected in series with the nonlinear element; wherein an output bandpass filter is coupled to an output of the nonlinear element, and wherein the output bandpass filter is configured to have a bandwidth less than a tooth spacing in the comb.

8. The method of claim 1, wherein the two nonlinear resonators are arranged in two branches of a parallel circuit arrangement whose output is connected in series with the nonlinear element.

9. The method of claim 8, wherein at least one of the two nonlinear resonators in one of the two branches comprises a mechanical resonator connected in series with at least a pair of varactors.

10. The method of claim 9, wherein the at least one of the two nonlinear resonators in one of the two branches further comprises a resistor connected in series with the mechanical resonator and with the at least a pair of varactors, the resistor allowing a damping coefficient of the resonance increased independently of a resonance of the other one of the two branches.

11. An apparatus for generating a phononic frequency comb, comprising two nonlinear resonators coupled via a nonlinear element.

12. The apparatus of claim 11, wherein the nonlinear element comprises at least a varactor or at least a varactor pair.

13. The apparatus of claim 11, wherein the nonlinear element is a nonlinear active element; wherein said nonlinear active element comprises an amplifier operated in saturation.

14. The apparatus of claim 12, wherein the at least a varactor pair comprises two varactors in an opposing series.

15. The apparatus of claim 12, wherein the at least a varactor or the at least a varactor pair comprises at least one temperature compensated varactor.

16. The apparatus of claim 11, wherein the two nonlinear resonators form a parallel circuit arrangement, itself connected in series with the nonlinear element; wherein an input bandpass filter is coupled to an input of the parallel circuit arrangement, and wherein the input bandpass filter is configured to have a center frequency near that of a drive frequency used to generate the phononic frequency comb.

17. The apparatus of claim 11, wherein the two nonlinear resonators form a parallel circuit arrangement, itself connected in series with the nonlinear element; wherein an output bandpass filter is coupled to an output of the nonlinear element, and wherein the output bandpass filter is configured to have a bandwidth less than a tooth spacing in the comb.

18. The apparatus of claim 11, wherein the two nonlinear resonators are arranged in two branches of a parallel circuit arrangement whose output is connected in series with the nonlinear element.

19. The apparatus of claim 18, wherein at least one of the two nonlinear resonators in one of the two branches comprises a mechanical resonator connected in series with at least a pair of varactors.

20. The apparatus of claim 19, wherein the at least one of the two nonlinear resonators in one of the two branches further comprises a resistor connected in series with the mechanical resonator and with the at least a pair of varactors, the resistor allowing a damping coefficient of the resonance increased independently of a resonance of the other one of the two branches.

* * * * *